(12) United States Patent
Frank

(10) Patent No.: US 11,086,226 B1
(45) Date of Patent: Aug. 10, 2021

(54) LIQUID TAMPED TARGETS FOR EXTREME ULTRAVIOLET LITHOGRAPHY

(71) Applicant: LAWRENCE LIVERMORE NATIONAL SECURITY, LLC, Livermore, CA (US)

(72) Inventor: Yechiel R. Frank, Berkeley, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 16/891,422

(22) Filed: Jun. 3, 2020

(51) Int. Cl.
  *G03F 7/20* (2006.01)
  *H05G 2/00* (2006.01)

(52) U.S. Cl.
  CPC ...... *G03F 7/70033* (2013.01); *G03F 7/70841* (2013.01); *H05G 2/005* (2013.01); *H05G 2/006* (2013.01); *H05G 2/008* (2013.01)

(58) Field of Classification Search
  CPC . G03F 7/70033; G03F 7/70841; H05G 2/005; H05G 2/006; H05G 2/008
  See application file for complete search history.

(56) References Cited

U.S. PATENT DOCUMENTS 9,332,625 B2  5/2016  Nishisaka et al.

*Primary Examiner* — Nicole M Ippolito
*Assistant Examiner* — Hanway Chang
(74) *Attorney, Agent, or Firm* — Eddie E. Scott

(57) ABSTRACT

An EUV light source including a vacuum chamber, a droplets injector operatively connected to the vacuum chamber for directing the droplets into the vacuum chamber, droplets produced by the droplets injector wherein the droplets have one side and another side opposite the one side, the droplets including a solid higher Z bead in a low Z liquid, and at least one laser beam directed onto the one side of the droplets.

22 Claims, 3 Drawing Sheets

Prior Art

LIQUID TAMPED TARGETS FOR EXTREME ULTRAVIOLET LITHOGRAPHY

STATEMENT AS TO RIGHTS TO APPLICATIONS MADE UNDER FEDERALLY SPONSORED RESEARCH AND DEVELOPMENT

The United States Government has rights in this application pursuant to Contract No. DE-AC52-07NA27344 between the United States Department of Energy and Lawrence Livermore National Security, LLC for the operation of Lawrence Livermore National Laboratory.

BACKGROUND

Field of Endeavor

The present application relates to extreme ultraviolet light sources for exposure equipment.

State of Technology

This section provides background information related to the present disclosure which is not necessarily prior art.

EUV light at 13.5 nm wavelength is currently the cutting-edge technology in the semiconductors manufacturing industry. These light sources are created by hitting micro droplets of tin with high intensity lasers.

U.S. Pat. No. 9,332,625 for an extreme ultraviolet light source apparatus provides the state of technology information reproduced below.

"In recent years, as semiconductor processes become finer, photolithography has been making rapid progress toward finer fabrication. In the next generation, microfabrication at 70 nm to 45 nm, further, microfabrication at 32 nm and beyond will be required. Accordingly, in order to fulfill the requirement for microfabrication at 32 nm and beyond, for example, exposure equipment is expected to be developed by combining an EUV light source for generating EUV light having a wavelength of about 13 nm and reduced projection reflective optics."

"In order to accomplish the above-mentioned purpose, an extreme ultraviolet light source apparatus according to one aspect of the present invention is an apparatus for generating plasma by applying a laser beam to a target material and entering extreme ultraviolet light radiated from the plasma into projection optics of exposure equipment, and the apparatus includes: a chamber in which the extreme ultraviolet light is generated; a target supply unit for supplying the target material into the chamber; a driver laser for applying the laser beam to the target material supplied by the target supply unit to generate the plasma; a collector mirror for collecting the extreme ultraviolet light radiated from the plasma; a positioning mechanism for positioning at least a part of the chamber in a predetermined location where an optical axis of the collected extreme ultraviolet light and an optical axis of the projection optics of the exposure equipment are aligned with each other; and a movement mechanism for moving at least the part of the chamber positioned in the predetermined location between the predetermined location and a maintenance area."

SUMMARY

Features and advantages of the disclosed apparatus, systems, and methods will become apparent from the following description. Applicant is providing this description, which includes drawings and examples of specific embodiments, to give a broad representation of the apparatus, systems, and methods. Various changes and modifications within the spirit and scope of the application will become apparent to those skilled in the art from this description and by practice of the apparatus, systems, and methods. The scope of the apparatus, systems, and methods is not intended to be limited to the particular forms disclosed and the application covers all modifications, equivalents, and alternatives falling within the spirit and scope of the apparatus, systems, and methods as defined by the claims.

The disclosed apparatus, systems, and methods include replacing liquid tin droplets with micro or smaller tin beads mixed in a low Z liquid. The use of mass limited targets that are embedded in a low Z liquid can solve several problems that are currently faced by the industry. It can significantly increase the total time of operation. It can eliminate the need for major expensive components that are used in prior art and need to be replaced frequently. The use of the new type of sources will further allow the design of even shorter wavelength sources to be used light sources for exposure equipment.

These sources can be used for imprinting the chip design on silicon wafers in the semi-conductor industry.

The apparatus, systems, and methods are susceptible to modifications and alternative forms. Specific embodiments are shown by way of example. It is to be understood that the apparatus, systems, and methods are not limited to the particular forms disclosed. The apparatus, systems, and methods cover all modifications, equivalents, and alternatives falling within the spirit and scope of the application as defined by the claims.

BRIEF DESCRIPTION OF THE DRAWINGS

The accompanying drawings, which are incorporated into and constitute a part of the specification, illustrate specific embodiments of the apparatus, systems, and methods and, together with the general description given above, and the detailed description of the specific embodiments, serve to explain the principles of the apparatus, systems, and methods.

DETAILED DESCRIPTION OF SPECIFIC EMBODIMENTS

Figure 1:
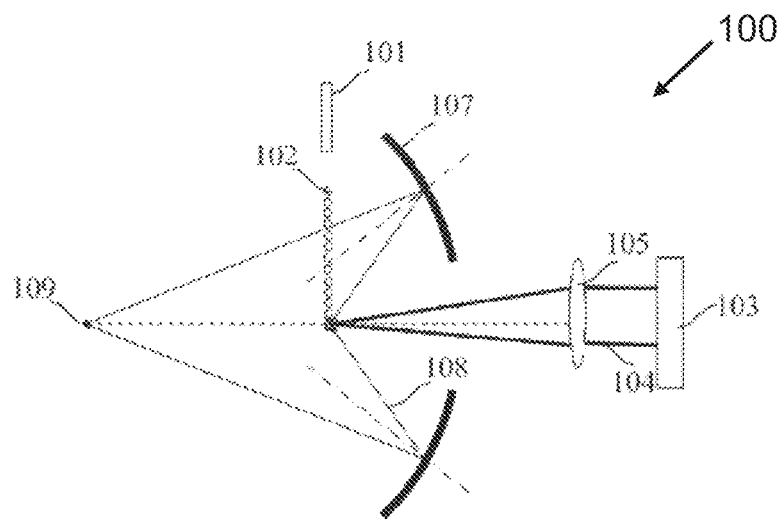
FIG. 1 illustrates a schematic view of an overall broad conception for a laser-produced plasma EUV light Source according to prior art.

Referring to the drawings, to the following detailed description, and to incorporated materials, detailed information about the apparatus, systems, and methods is provided including the description of specific embodiments. The detailed description serves to explain the principles of the apparatus, systems, and methods. The apparatus, systems, and methods are susceptible to modifications and alternative forms. The application is not limited to the particular forms disclosed. The application covers all modifications, equivalents, and alternatives falling within the spirit and scope of the apparatus, systems, and methods as defined by the claims.

Referring to the drawings and in particular to FIG. 1, a prior art system is illustrated. The prior art system is illustrated and described in U.S. Pat. No. 9,332,626 for a EUV light source and exposure apparatus which is incorporated herein by this reference. The prior art system is designated generally by the reference numeral 100. The prior art system 100 includes the structural elements identified and described below.

Reference numeral 101—Tin(Sn) spray nozzle,
Reference numeral 102—Tin (Sn) droplets,
Reference numeral 103—Laser,
Reference numeral 104—Laser beam,
Reference numeral 107—Sing-piece focusing mirror,
Reference numeral 108—Radiated EUV light, and
Reference numeral 109—Central focusing point, The structural elements of the prior art system 100 having been identified and described, the operation of the prior system will now be considered. As shown in FIG. 1, the EUV light source includes a tin (Sn) spray nozzle 101. The tin (Sn) spray nozzle 101 sprays tin (Sn) droplets 102 downwardly. The EUV light source also includes a laser source 103. The laser source 103 generates a laser beam 104. The laser beam 104 is focused by the lens unit 105; and bombards the Sn droplets 102. The bombarded tin (Sn) droplets 102 generate plasma; and the plasma radiates EUV 108. Further, the EUV light source also includes a sing-piece focusing mirror 107. The focusing mirror 101 collects the radiated EUV light 108; and further focuses the collected EUV light 108 at a central focusing point 109.

The high-energy laser 103 fires on the microscopic droplet of molten tin 102 and turns it into plasma, emitting EUV light, which then is focused into a beam 108. The EUV beam exiting from the plasma is collected by the condensing mirror, passes through a point called the intermediate focus (IF), and illuminates a reflection-type mask after it has been reshaped by the illumination optics. The EUV beam reflected by the mask is exposed by the projection optics to form a pattern on photoresist that is coated on a wafer surface.

The hottest plasma is created in the laser facing side of the droplet while the rest of the droplet remains relatively cold therefore blocking most of the radiation in that direction. In addition, when hit by the laser material particles are also emitted from the droplet. Material particle are emitted in two forms: ions and neutral ejecta. This material creates a huge problem as it can contaminate both the wafer creation system and the multilayer collecting mirror. Eventually target material is accumulated on the mirror forcing the replacement/cleaning of the mirror. This process is both very expensive and forces a long maintenance down time of the machine.

Figure 2:
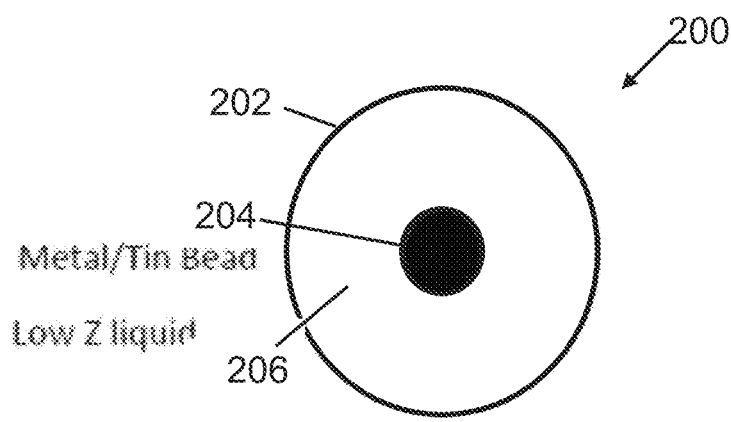
FIG. 2 illustrates one embodiment of the inventor's apparatus for the light source target.

Referring to FIG. 2, one embodiment of the inventor's target apparatus is illustrated. This embodiment is designated generally by the reference numeral 200. The embodiment 200 is created by replacing the prior art liquid tin droplets 102 shown in FIG. 1 with micro solid beads. Another embodiment is created by replacing the prior art liquid tin droplets 102 shown in FIG. 1 with beads even smaller than micrometer scale beads. FIG. 1 is a schematic depiction illustrating the inventor's apparatus 200 that includes the structural elements identified and described below.

Reference numeral 204—solid bead,
Reference numeral 206—Low Z liquid,

The structural elements of the inventor's target apparatus 200 having been identified and described, the operation of the inventor's target apparatus, systems, and methods 200 will now be considered. The prior art liquid tin droplets 102 shown in FIG. 1 are replaced with micro solid beads 204. The beads 204 can be created using well known processes. For example, this can be done in a separate setting using prior art's tin droplets generator which will then be frozen into beads 204. The beads 204 are contained in a lower Z liquid 206. In one embodiment the lower Z liquid 206 is water. In another embodiment the lower Z liquid 206 is liquid methane.

Figure 3:
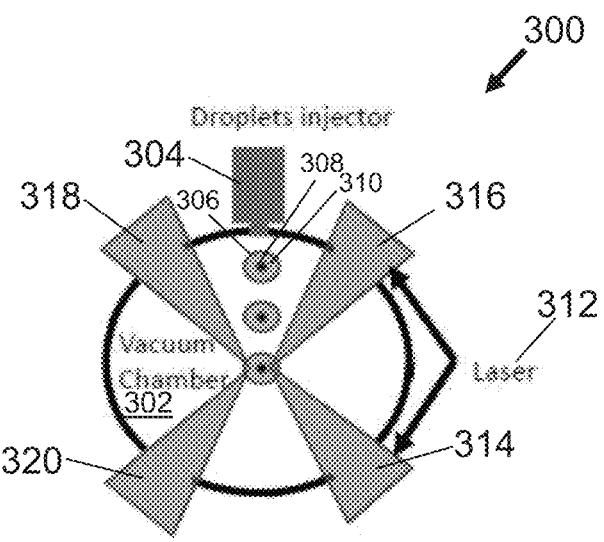
FIG. 3 illustrates one embodiment of the inventor's apparatus, systems, including laser configuration, target and target delivery system.

Referring to FIG. 3, one embodiment of the inventor's apparatus, systems, and methods is illustrated. This embodiment is designated generally by the reference numeral 300. FIG. 3 is a schematic depiction illustrating the inventor's apparatus, systems, and methods 300 that includes the structural elements identified and described below.

Reference numeral 302—Vacuum chamber, Reference numeral 304—Droplets injector, Reference numeral 306—Droplets, Reference numeral 308—Metal/Tin bead, Reference numeral 310—Low Z liquid, Reference numeral 312—Laser, Reference numeral 314—Laser beam 1, Reference numeral 316—Laser beam 2, Reference numeral 318—Laser beam 3, and Reference numeral 314—Laser beam 4.

The structural elements of the inventor's apparatus and, systems 300 having been identified and described, the operation of the inventor's apparatus, systems, and methods 300 will now be considered. FIG. 3 shows an embodiment of the inventor's target configuration as it is inserted into a vacuum chamber 302.

A droplets injector 304 injects droplets 306 into the vacuum chamber 302. Each of the droplets 306 are made of Metal/Tin bead 308 in a Low Z liquid 310 as previously described. The laser 312 produces a laser beam which is split into laser beam 1, laser beam 2, laser beam 3, laser beam 3 and laser beam 4. Laser beam 1 and laser beam 2 are directed to hit a droplet 306 from one side of the droplet. Laser beam 3 and laser beam 4 are directed to hit the droplet 306 from the other side of the droplet. Alternately, 4 separated laser beams can be used. Different configurations for laser irradiation, e.g. splitting the laser into more beams to maintain better symmetry can also be considered.

In one embodiment, the temporal shape of the laser pulse can be constructed of two phases. A pre-pulse possibly generated by a different laser system with similar spatial structure, delivering a short pulse with lower total energy and a main longer pulse creating the main plasma source. The pre-pulse is used to deform the target in a prescribed way for better coupling of the main pulse and the target as will be described later. Hitting the target material from both sides and at an angle rather than in perpendicular allows for the utilizing of radiation emitted from both sides rather than a single side as in prior art.

Figure 4:
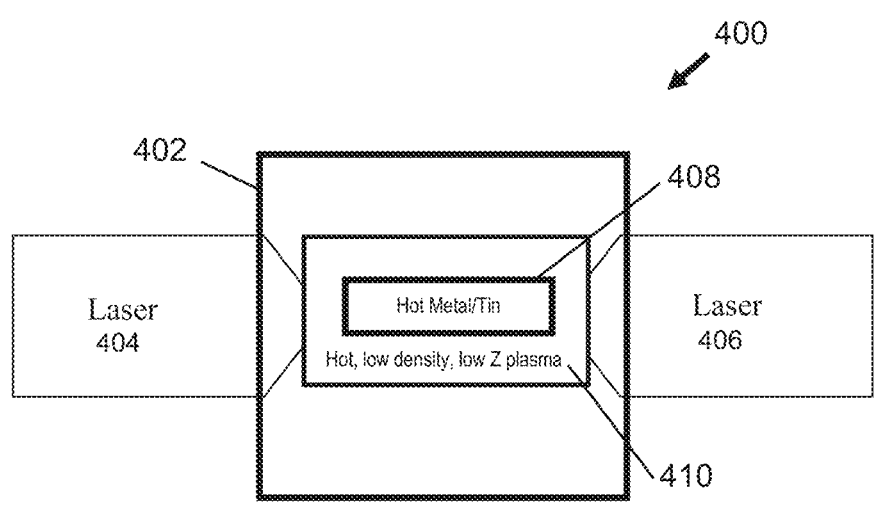
FIG. 4 provides a schematic overview of the plasma formation and target confinement scheme.

Referring to FIG. 4, the inventor's target apparatus, systems, and methods after being deformed by an initial phase of the laser irradiation is illustrated. This embodiment is designated generally by the reference numeral 400. FIG. 4 is a schematic depiction illustrating the inventor's target apparatus, systems, and methods 400 that includes the structural elements identified and described below.

Reference numeral 402—Hot Metal/Tin bead; and

Reference numeral 404—Hot, low density, low Z plasma.

The structural elements of the inventor's apparatus and, systems 400 having been identified and described, the operation of the inventor's apparatus, systems, and methods 400 will now be considered. The pre-pulse or in a different embodiment the first phase of the main pulse, laser beams hit the droplet containing the Metal/Tin bead 402 from both sides. This will cause the deformation of the droplet into a pancake/disk shape shown in FIG. 4. This deformation can serve to increase the laser target interaction area while maintaining the radial "casing" of the internal bead target by the low Z liquid. It also serves to remove some/all of the low Z material from at the axial dimension of the target.

Figure 5:
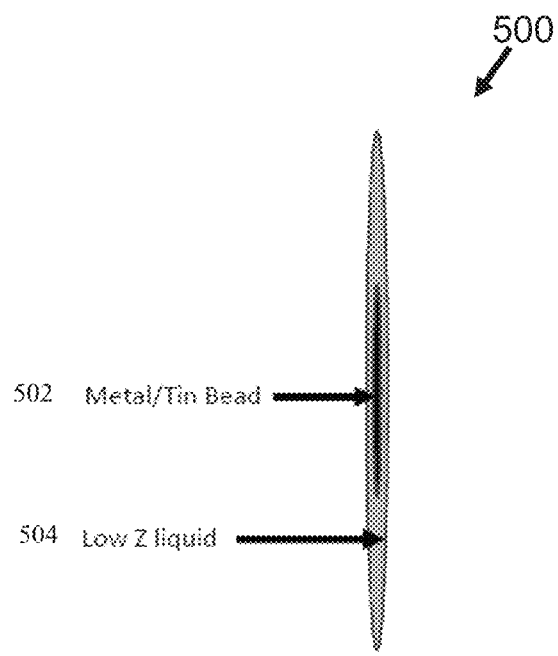
FIG. 5 provides one embodiment of the initial target deformation scheme used as an initial condition for target expansion.

Referring to FIG. 5, the inventor's expected target shape and expansion during the irradiation by the main laser pulse is illustrated. This embodiment is designated generally by the reference numeral 500. FIG. 5 is a schematic depiction illustrating the inventor's apparatus, systems, and methods 400 that includes the structural elements identified and described below.

Reference numeral 502—Vacuum chamber;

Reference numeral 504—Laser directed to one side of target;

Reference numeral 506—Laser directed to other side of target;

Reference numeral 508—Hot Metal/Tin target; and

Reference numeral 510—Hot, low density, low Z plasma.

The structural elements of the inventor's apparatus and, systems 500 having been identified and described, the operation of the inventor's apparatus, systems, and methods 500 will now be considered. FIG. 5 shows the inventor's target configuration in vacuum chamber 502 as it evolves during the irradiation by the main laser pulse. The laser 504 is directed to hit a droplet 512 from one side of the droplet. The laser 506 is directed to hit the droplet 512 from the other side of the droplet. The droplet 512 consists of the inner higher Z (in one embodiment tin) bead material 508 and the lower Z material in the outer radius 510. Both materials are heated by the laser and produce hot plasma. A hot, low density, low Z plasma 510 is produced in the outer perimeter of the droplet. The hot, low density, low Z plasma 510 serves as a radial confinement "casing" which holds the inner metal plasma from freely expanding in the radial direction. Furthermore, the low Z hot plasma also captures radiation emitted by the higher Z material and prevents it from being emitted in the radial direction. These processes will be described in more detail hereafter.

Figure 6:
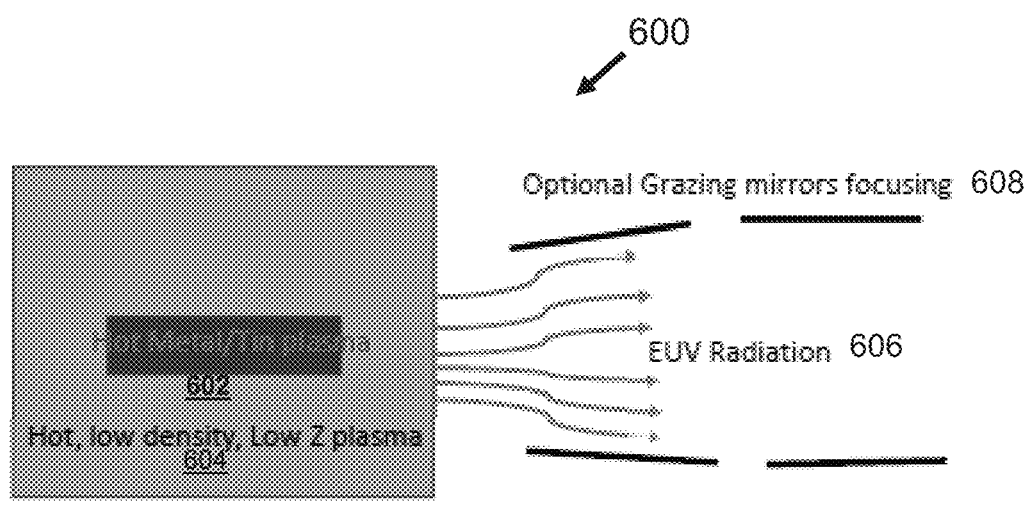
FIG. 6 provides further details of the inventor's apparatus, systems, and methods

Referring to FIG. 6, the inventor's radiation emission and collection apparatus, systems, and methods designated generally by the reference numeral 600 is further illustrated. FIG. 6 is a schematic depiction that includes the structural elements identified and described below.

Reference numeral 602—Hot Metal/Tin plasma;

Reference numeral 604—Hot, low density, low Z plasma;

Reference numeral 606—EUV radiation; and

Reference numeral 608—Optional radiation collecting device.

The structural elements of the inventor's apparatus and, systems 600 having been identified and described, the operation will now be considered. As previously described, the laser is directed to hit the droplet at an angle from both sides. The Hot Metal/Tin plasma 602 and the Hot, low density, low Z plasma 604 are produced as previously described. The plasma formation of both the low Z liquid and the high Z bead is expected to be mostly one dimensional in the axial dimension. The low Z plasma 604 is in the outer radius while the higher Z material 602 in the inner. In such configuration the lower Z plasma 604 serves as a casing for the inner higher Z material creating a Lambertian emission source. In such a case more radiation is emitted in the direction perpendicular to the target and can be collected by the optional radiation collecting device 608 with no need to collect from the entire $2\pi$ solid angle.

The inventor's apparatus and, systems 600 have many advantages some of which are listed and described below.

Radiation emitted from both sides of the target can be utilized. This will yield an immediate increase of 2× in output power. However, the other advantages of the inventor's apparatus and, systems can be utilized if choosing to use it in single side irradiation.

Another advantage of this configuration is the fact that a smaller amount of tin/metal material can be used. In one embodiment the target is being hit from both directions the laser pulse and can be designed such that the laser fully burns through the metal. In such a case no neutral metal is ejected. The entire mass is ionized and therefore can be much more easily diverted using other known methods. This will help shielding the rest of the process from debris.

In prior art, beam exiting from the plasma is collected by a condensing multilayer mirror, passes through a point called the intermediate focus (IF), and illuminates a reflection-type mask after it has been reshaped by the illumination optics. The beam reflected by the mask is exposed by the projection optics to form a pattern on photoresist that is coated on a wafer surface.

In the inventor's design, EUV radiation emitted from the high Z plasma 602 in the radial direction will be mostly absorbed by the lower Z plasma and reemitted by it therefore returning energy back into the high Z material.

In this design the radiation emitted from the front surface of the target is Lambertian allowing the use of mostly axial direction emission without significant loss. The use of angled laser prevents the laser from blocking this line of sight. As a result, there is no need to use large multilayer mirrors that are expensive and need to be replace frequently.

Since the new design does not use multilayer mirrors, the use of other target materials is much simpler allowing for future shorter wavelength radiation sources.

Although the description above contains many details and specifics, these should not be construed as limiting the scope of the application but as merely providing illustrations of some of the presently preferred embodiments of the apparatus, systems, and methods. Other implementations, enhancements and variations can be made based on what is described and illustrated in this patent document. The features of the embodiments described herein may be combined in all possible combinations of methods, apparatus, modules, systems, and computer program products. Certain features that are described in this patent document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination. Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Therefore, it will be appreciated that the scope of the present application fully encompasses other embodiments which may become obvious to those skilled in the art. In the claims, reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device to address each and every problem sought to be solved by the present apparatus, systems, and methods, for it to be encompassed by the present claims. Furthermore, no element or component in the present disclosure is intended to be dedicated to the public regardless of whether the element or component is explicitly recited in the claims. No claim element herein is to be construed under the provisions of 35 U.S.C. 112, sixth paragraph, unless the element is expressly recited using the phrase "means for."

While the apparatus, systems, and methods may be susceptible to various modifications and alternative forms, specific embodiments have been shown by way of example in the drawings and have been described in detail herein. However, it should be understood that the application is not intended to be limited to the particular forms disclosed. Rather, the application is to cover all modifications, equivalents, and alternatives falling within the spirit and scope of the application as defined by the following appended claims.

The invention claimed is:

1. An EUV light source, comprising:
a vacuum chamber,
a droplets injector operatively connected to said vacuum chamber for directing said droplets into said vacuum chamber,
droplets produced by said droplets injector wherein said droplets have one side and another side opposite said one side,
said droplets including a solid higher Z bead in a low Z liquid,
a laser beam directed onto said one side of said droplets,
another laser beam directed onto said other side of said droplets, and
a laser that produces said laser beam directed onto said one side of said droplets and said another laser beam directed onto said other side of said droplets or
multiple lasers wherein said multiple lasers produce said laser beam directed onto said one side of said droplets and said another laser beam directed onto said other side of said droplets.

2. Laser beams onto said one side of said droplets and said another laser beam directed onto said other side of said droplets of claim 1 hit the droplet at an angle from the plain perpendicular to the droplet injection direction.

3. The EUV light source of claim 1 wherein said laser beam directed onto said one side of said droplets and said another laser beam directed onto said other side of said droplets are produced by a single laser.

4. The EUV light source of claim 1 wherein said laser beam directed onto said one side of said droplets and said another laser beam directed onto said other side of said droplets are produced by multiple lasers.

5. The EUV light source of claim 1 wherein said laser beam directed onto said one side of said droplets and said another laser beam directed onto said other side of said droplets cause deformation of said droplets into a co-centric disk-like shape with low material encasing the higher Z material.

6. The EUV light source of claim 1 wherein said droplets produced by said droplets injector contain micro tin beads.

7. The EUV light source of claim 1 wherein said droplets produced by said droplets injector contain beads that are smaller than micro tin beads.

8. The EUV light source of claim 1 wherein said low Z liquid is water.

9. The EUV light source of claim 1 wherein said low Z liquid is liquid methane.

10. An EUV light source, comprising:
a vacuum chamber,
a droplets injector operatively connected to said vacuum chamber for directing said droplets into said vacuum chamber,
droplets produced by said droplets injector wherein said droplets have one side and another side opposite said one side,
said droplets including a higher Z bead in a low Z liquid,
first multiple laser beams directed onto said one side of said droplets,
second multiple laser beams directed onto said other side of said droplets, and
a laser that produces said first multiple laser beams directed onto said one side of said droplets and second multiple laser beams directed onto said other side of said droplets or
multiple lasers wherein said multiple lasers produce said first multiple laser beams directed onto said one side of said droplets and second multiple laser beams directed onto said other side of said droplets.

11. The EUV light source of claim 10 wherein said droplets produced by said droplets injector contain micro higher Z beads.

12. The EUV light source of claim 10 wherein said droplets produced by said droplets injector contain beads that are smaller than micro higher Z beads.

13. The EUV light source of claim 10 wherein said low Z liquid is water.

14. The EUV light source of claim 10 wherein said low Z liquid is liquid methane.

15. A method of producing and operating a EUV light source, comprising the steps of:
using a droplets injector for directing droplets into a vacuum chamber wherein said droplets have one side and another side opposite said one side and
wherein said droplets include a higher Z bead in a low Z liquid,
directing a laser beam onto said one side of said droplets, and
directing another laser beam onto said other side of said droplets.

16. The method of producing and operating a EUV light source of claim 15 wherein said steps of directing a laser beam onto said one side of said droplets and directing another laser beam onto said other side of said droplets comprises using a laser that produces said laser beam directed onto said one side of said droplets and said another laser beam directed onto said other side of said droplets or using multiple lasers wherein said multiple lasers produce said laser beam directed onto said one side of said droplets and said another laser beam directed onto said other side of said droplets.

17. The method of producing and operating a EUV light source of claim 15 wherein said steps of directing a laser beam onto said one side of said droplets and directing another laser beam onto said other side of said droplets cause deformation of said droplets into a disk shape.

18. The method of producing and operating a EUV light source of claim 15 wherein said steps of directing a laser beam onto said one side of said droplets and directing another laser beam onto said other side of said droplets cause deformation of said droplets into a co-centric disk-like shape.

19. The method of producing and operating a EUV light source of claim 15 wherein said droplets produced by said droplets injector include a micro higher Z bead.

20. The method of producing and operating a EUV light source of claim 15 wherein said droplets produced by said droplets injector include beads that are smaller than micro higher Z beads.

21. The method of producing and operating a EUV light source of claim 15 wherein said low Z liquid is water.

22. The method of producing and operating a EUV light source of claim 15 wherein said low Z liquid is liquid methane.

* * * * *